(12) United States Patent
Lindgren et al.

(10) Patent No.: US 7,898,063 B2
(45) Date of Patent: Mar. 1, 2011

(54) THROUGH SUBSTRATE ANNULAR VIA INCLUDING PLUG FILLER

(75) Inventors: Peter James Lindgren, Essex Junction, VT (US); Edmund Juris Sprogis, Underhill, VT (US); Anthony Kendall Stamper, Williston, VT (US); Kenneth Jay Stein, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 12/032,642

(22) Filed: Feb. 16, 2008

(65) Prior Publication Data

US 2009/0206488 A1 Aug. 20, 2009

(51) Int. Cl.
*H01L 23/48* (2006.01)
(52) U.S. Cl. ... 257/621; 257/774; 257/773; 257/E23.011
(58) Field of Classification Search .................. 257/774, 257/621, 773, E23.011
See application file for complete search history.

(56) References Cited

U.S. PATENT DOCUMENTS

| | | | |
|---|---|---|---|
| 5,599,744 A | 2/1997 | Koh et al. | |
| 6,458,696 B1 | 10/2002 | Gross | |
| 7,186,586 B2 | 3/2007 | Savastiouk et al. | |
| 7,345,350 B2* | 3/2008 | Sinha | 257/449 |
| 7,541,677 B2* | 6/2009 | Kawano | 257/758 |
| 7,633,167 B2* | 12/2009 | Kawano et al. | 257/774 |
| 2004/0072422 A1 | 4/2004 | Sinha | |
| 2005/0116333 A1* | 6/2005 | Akiyama | 257/698 |
| 2005/0200027 A1 | 9/2005 | Sinha et al. | |
| 2005/0247943 A1 | 11/2005 | Sinha | |
| 2005/0248002 A1* | 11/2005 | Newman et al. | 257/621 |
| 2006/0275946 A1 | 12/2006 | MacNamara et al. | |
| 2007/0045820 A1 | 3/2007 | Rybnicek | |
| 2007/0132105 A1* | 6/2007 | Akram et al. | 257/774 |
| 2008/0179755 A1* | 7/2008 | Andry et al. | 257/774 |
| 2009/0134497 A1* | 5/2009 | Barth et al. | 257/621 |

OTHER PUBLICATIONS

International Search Report, PCT/US2009/033723, Apr. 3, 2009.

* cited by examiner

*Primary Examiner* — Eugene Lee
(74) *Attorney, Agent, or Firm* — Scully, Scott, Murphy & Presser, P.C.; Richard M. Kotulak, Esq.

(57) ABSTRACT

A through substrate via includes an annular conductor layer at a periphery of a through substrate aperture, and a plug layer surrounded by the annular conductor layer. A method for fabricating the through substrate via includes forming a blind aperture within a substrate and successively forming and subsequently planarizing within the blind aperture a conformal conductor layer that does not fill the aperture and plug layer that does fill the aperture. The backside of the substrate may then be planarized to expose at least the planarized conformal conductor layer.

8 Claims, 7 Drawing Sheets

THROUGH SUBSTRATE ANNULAR VIA INCLUDING PLUG FILLER

BACKGROUND

1. Field of the Invention

The invention relates generally to through substrate vias within microelectronic substrates. More particularly, the invention relates to enhanced performance through substrate vias within microelectronic substrates.

2. Background of the Invention

Microelectronic structures, and in particular semiconductor structures, include microelectronic devices such as semiconductor devices. The microelectronic devices, such as the semiconductor devices, are located and formed over a microelectronic substrate, such as a semiconductor substrate. The microelectronic devices are connected and interconnected using patterned conductor layers that are separated by dielectric layers.

In addition to the connection and interconnection of microelectronic devices within a microelectronic structure while using patterned conductor layers that are separated by dielectric layers, microelectronic structures, such as but not limited to semiconductor structures, also frequently use through substrate via structures that provide an electrical connection from a top side to a bottom side of a microelectronic substrate, such as a semiconductor substrate.

Through substrate vias when used within microelectronic substrates may serve functions that include, but are not necessarily limited to, microelectronic substrate grounding functions and microelectronic substrate electrical biasing functions.

While through substrate vias within microelectronic substrates serve valuable functions within microelectronic structures, through substrate vias within microelectronic substrates are not entirely without problems. In particular, through substrate vias are often difficult to efficiently fabricate with a comparatively narrow linewidth (i.e., in a range from about 1 to about 3 microns), while completely penetrating through a microelectronic substrate, such as a semiconductor substrate, having an increased thickness.

Various aspects of through substrate vias within microelectronic structures are known in the microelectronic fabrication art.

For example, Sinha (or Sinha et al.), in U.S. Pub. No. 2004/0072422, U.S. Pub. No. 2005/0200027 and U.S. Pub. No. 2005/0247943, teaches various methods for forming a through wafer via through a semiconductor substrate. Each particular method uses in-part a plating method for forming the through wafer via.

In addition, MacNamara et al., in U.S. Pub. No. 2006/0275946, teaches a method for forming a through wafer via within a microelectronic structure. This particular method uses in-part the through wafer via as a location for electrically connecting a discrete electrical device.

Further, Rybnicek, in U.S. Pub. No. 2007/0045820, teaches another method for forming a through wafer via through a semiconductor substrate. This particular method includes plating a conductor material within a blind aperture within a semiconductor substrate, and then planarizing a back surface of the semiconductor substrate to expose the bottom surface of the plated conductor material.

Finally, Savastiouk et al., in U.S. Pat. No. 7,186,586, teaches a packaging substrate that includes a semiconductor interposer that includes through wafer via that includes a contact pad that protrudes from the semiconductor interposer. The protruding contact pad is formed and located to register with an aperture within a semiconductor chip which is intended to mate with the semiconductor interposer and the packaging substrate.

The use of through substrate vias is likely to be of continued prominence and importance as microelectronic device and microelectronic structure dimensions decrease, and as microelectronic circuit functionality and performance requirements increase. To that end, desirable are through substrate via structures having enhanced performance, and methods for fabricating those through substrate via structures.

SUMMARY

The invention provides a microelectronic structure that includes a through substrate via, and a method for fabricating the microelectronic structure that includes the through substrate via. In particular, the microelectronic structure includes a through substrate via that includes: (1) an annular conductor layer located within an aperture through a substrate but not filling the aperture within the substrate, such as a semiconductor substrate, where the annular conductor layer may optionally have an enclosed end; and (2) a plug layer (i.e., typically, but not necessarily a dielectric plug layer) surrounded by the annular conductor layer and completely filling the aperture within the substrate. A method for fabricating the microelectronic structure includes forming a blind aperture within a microelectronic substrate, such as a semiconductor substrate. Amongst other optional layers, a conformal conductor layer is located and formed into the blind aperture while not filling the blind aperture, and a dielectric plug layer is located and formed over the conformal conductor layer and completely filling the blind aperture. Excess portions of the dielectric plug layer and the conformal conductor layer are planarized and a bottom portion of the substrate is also removed to expose at least the conformal conductor layer.

An annular through substrate via in accordance with the invention provides value insofar as such an annular through substrate via is more readily and uniformly fabricated since such an annular through substrate via may be fabricated using a wider blind aperture than a blind aperture of an analogous via that comprises a non-annular via.

A particular microelectronic structure in accordance with the invention includes a substrate that includes an aperture that penetrates through the substrate. This particular microelectronic structure also includes an annular conductor layer located at a periphery of the aperture and not filling the aperture. This particular microelectronic structure also includes a plug layer located surrounded by the annular conductor layer and filling the aperture.

Another particular microelectronic structure in accordance with the invention includes a semiconductor substrate including an aperture that penetrates through the semiconductor substrate. This particular microelectronic structure also includes an annular liner layer located upon the semiconductor substrate at a periphery of the aperture and not filling the aperture. This particular microelectronic structure also includes an annular conductor layer located upon the annular liner layer and not filling the aperture. This particular microelectronic structure also includes an annular stop layer located upon the annular conductor layer and not filling the aperture. This particular microelectronic structure also includes a plug layer located upon the annular stop layer and filling the aperture.

A particular method for fabricating a microelectronic structure in accordance with the invention includes forming a blind aperture within a substrate. This particular method also includes successive layering and subsequently planarizing within the blind aperture a conformal conductor layer that does not completely fill the blind aperture and a plug layer that does completely fill the aperture. This particular method also includes planarizing a backside of the substrate to expose at least the conformal conductor layer.

Another particular method for fabricating a microelectronic structure in accordance with the invention includes forming a blind aperture within a semiconductor substrate. This particular method also includes successive layering and subsequently planarizing within the blind aperture a conformal dielectric liner layer that does not completely fill the aperture, a conformal conductor layer that does not completely fill the blind aperture, a conformal stop layer that does not completely fill the aperture and a plug layer that does completely fill the aperture. This particular method also includes planarizing a backside of the substrate to expose at least the conformal conductor layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which includes a microelectronic structure and a method for fabricating the microelectronic structure, is understood within the context of the description set forth below. The description set forth below is understood within the context of the drawings described above. Since the drawings are intended for illustrative purposes, the drawings are not necessarily drawn to scale.

FIG. 1 to FIG. 13 show a series of schematic cross-sectional diagrams illustrating the results of progressive stages in fabricating a microelectronic structure that includes a through substrate via structure in accordance with a particular embodiment of the invention. This particular embodiment of the invention comprises a sole embodiment of the invention.

Figure 1:
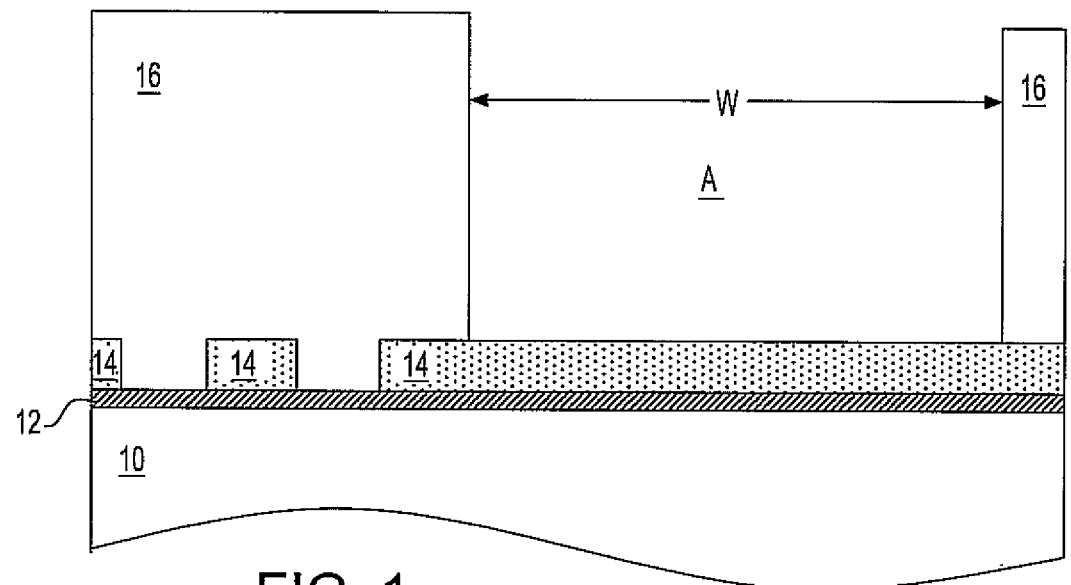
FIG. 1 to FIG. 13 show a series of schematic cross-sectional diagrams illustrating the results of progressive stages in fabricating a microelectronic structure in accordance with a particular embodiment of the invention.

FIG. 1 shows a substrate 10. A pad dielectric 12 is located upon the substrate 10. A hard mask 14 is located upon the pad dielectric 12. A resist layer 16 is located upon the exposed portions of the pad dielectric 12 and the hard mask 14.

The substrate 10 may in general comprise a material selected from the group including but not limited to ceramic materials and semiconductor materials. Particular ceramic materials from which may be comprised the substrate 10 may include, but are not necessarily limited to, alumina, silica, titania and zirconia ceramic materials. Particular semiconductor materials from which may be comprised the substrate 10 may include, but are not necessarily limited to, silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the substrate 10 comprises a semiconductor substrate that has a conventional thickness that may be up to at least about 1 millimeter.

Although not specifically illustrated within the schematic cross-sectional diagram of FIG. 1, when the substrate 10 in particular comprises a semiconductor material, such a semiconductor substrate may have located and formed therein and/or thereupon microelectronic devices, such as in particular semiconductor devices. Such microelectronic devices may include, but are not necessarily limited to active semiconductor devices such as but not limited to transistors and diodes. Such microelectronic devices may also include, but are also not necessarily limited to passive devices which need not necessarily be semiconductor devices, such as but not limited to resistors and capacitors.

The pad dielectric 12 comprises a pad dielectric material. Suitable pad dielectric materials may include, but are not necessarily limited to, oxides, nitrides and oxynitrides of a base semiconductor material from which may be comprised the substrate 10 when the substrate comprises a semiconductor material. Oxides, nitrides and oxynitrides of other materials are not excluded, whether semiconductor materials or other than semiconductor materials. The pad dielectric 12 may be formed using methods that are otherwise generally conventional in the microelectronic fabrication art. Non-limiting examples include thermal or plasma oxidation or nitridation methods, chemical vapor deposition methods and physical vapor deposition methods. Typically, the pad dielectric 12 may generally comprise, but is not generally limited to, a silicon nitride pad dielectric material that has a thickness from about 400 to about 1200 angstroms.

The hard mask 14 comprises a hard mask material. Hard mask materials may in general be selected from the same group of dielectric materials from which is comprised the pad dielectric 12, given the proviso that the dielectric material from which is comprised the pad dielectric 12 and the dielectric material from which is comprised the hard mask 14 do not in general comprise the same dielectric material, or similar dielectric materials that have an indistinguishable etch selectivity within the context of a particular etch method. Similarly, the hard mask 14 may also be formed using methods that are analogous, equivalent or identical to the methods that are used for forming the pad dielectric 12. Typically, when the pad dielectric 12 comprises a silicon nitride dielectric material, the hard mask 14 comprises a silicon oxide dielectric material. Typically, such a silicon oxide hard mask 14 has a thickness from about 8000 to about 20,000 angstroms.

The resist layer 16 comprises a resist material. Suitable resist materials from which may be comprised the resist layer 16 include positive resist materials, negative resist materials and hybrid resist materials that possess characteristics of both positive resist materials and negative resist materials. Such a resist layer 16 may be formed using generally conventional spin-coating methods, exposed using generally conventional lithographic (i.e., photolithographic methods and electron beam lithographic methods) and developed using generally conventional solvent developing methods. Typically, the resist layer 16 comprises a positive resist material or a negative resist material that has a thickness from about 20,000 to about 60,000 angstroms. As is illustrated in FIG. 1, the resist layer 16 defines an aperture A that has an aperture width W from about 5 to about 15 microns. Plan view geometries of the aperture A may include, but are not necessarily limited to circles, squares, rectangles, polyhedra and other regular and irregular geometries.

Figure 2:
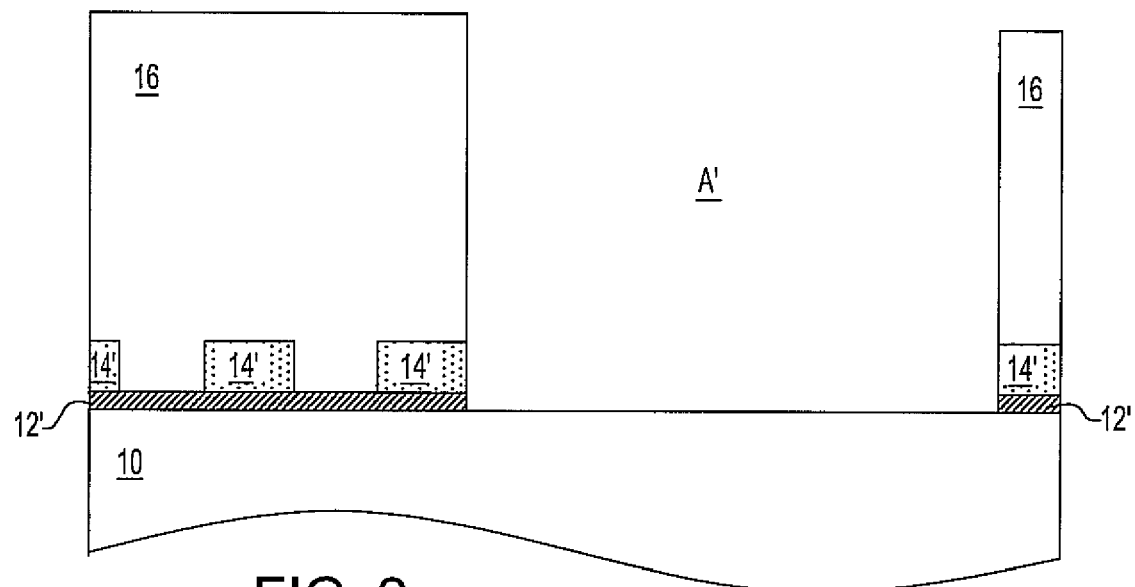

FIG. 2 shows the results of patterning the hard mask 14 and the pad dielectric 12 while using the resist layer 16 as a mask, to form a hard mask 14' located upon a pad dielectric 12' that in conjunction with the resist layer 16 provide an aperture A' that is extended in comparison with the aperture A that is illustrated in FIG. 1. Exposed at the bottom of the aperture A' is the substrate 10. The foregoing patterning is typically effected while using a plasma etch method that provides the hard mask 14' and the pad dielectric 12' with nominally straight sidewalls. Typically, the plasma etch method uses an etchant gas composition appropriate to the materials from which are comprised the hard mask 14; and the pad dielectric 12. Typically a fluorine containing etchant gas composition may be used for etching a silicon containing dielectric material such as a silicon oxide dielectric material or a silicon nitride dielectric material.

Figure 3:
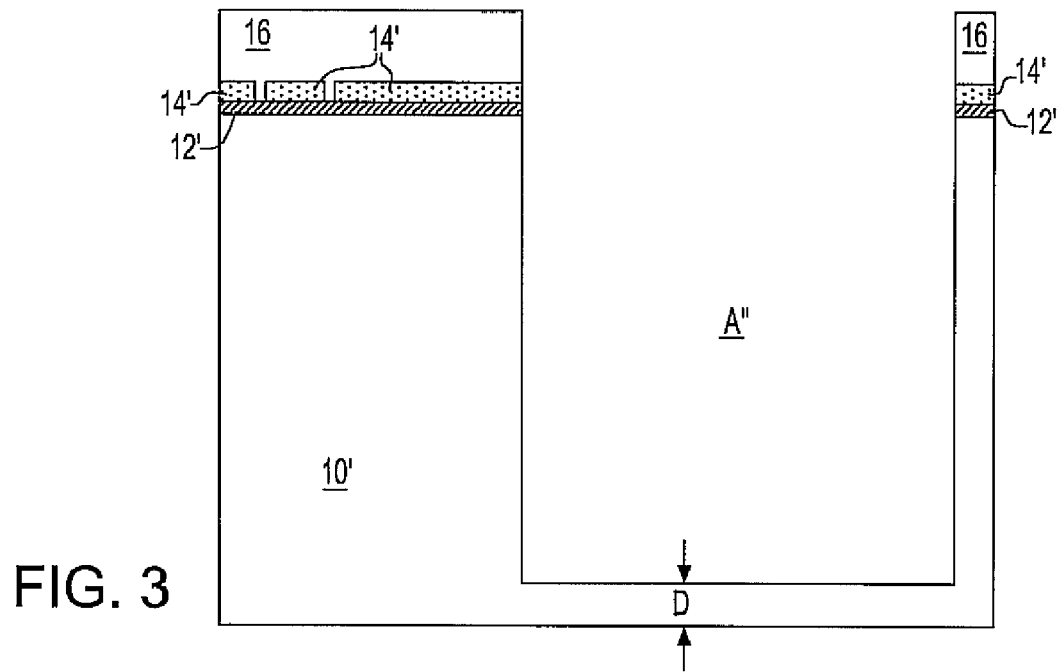

FIG. 3 first shows a vertically extended schematic cross-sectional diagram of the microelectronic structure whose schematic cross-sectional diagram is illustrated in FIG. 2. FIG. 3 also shows the results of further etching the substrate 10 that is illustrated in FIG. 2 to provide a substrate 10' while using the resist layer 16, the hard mask 14' and the pad dielectric 12' as a mask. Thus, a further extended aperture A" is formed from the aperture A' that is illustrated in FIG. 2. Typically, the further extended aperture A", absent the resist layer 16, has an aspect ratio (i.e., height to width) from about 10:1 to about 30:1 and more preferably from about 10:1 to about 20:1. The foregoing etching is also typically effected while using a plasma etch method that provides the extended aperture A" with nominally straight sidewalls. As is understood by a person skilled in the art, when etching a semiconductor material such as a silicon containing semiconductor material from which may be comprised the substrate 10, a particular plasma etch method will typically use a fluorine containing etchant gas composition using the Bosch Etch process, as is generally understood by a person skilled in the art. Chlorine or bromine containing etchant gas compositions may under certain circumstances also be used.

As is illustrated within the schematic cross-sectional diagram of FIG. 3, the aperture A" is a blind aperture that includes an enclosed bottom. A distance D from the enclosed bottom of the blind aperture A" to the bottom or the substrate 10' is typically from about 500 to about 700 microns.

Figure 4:
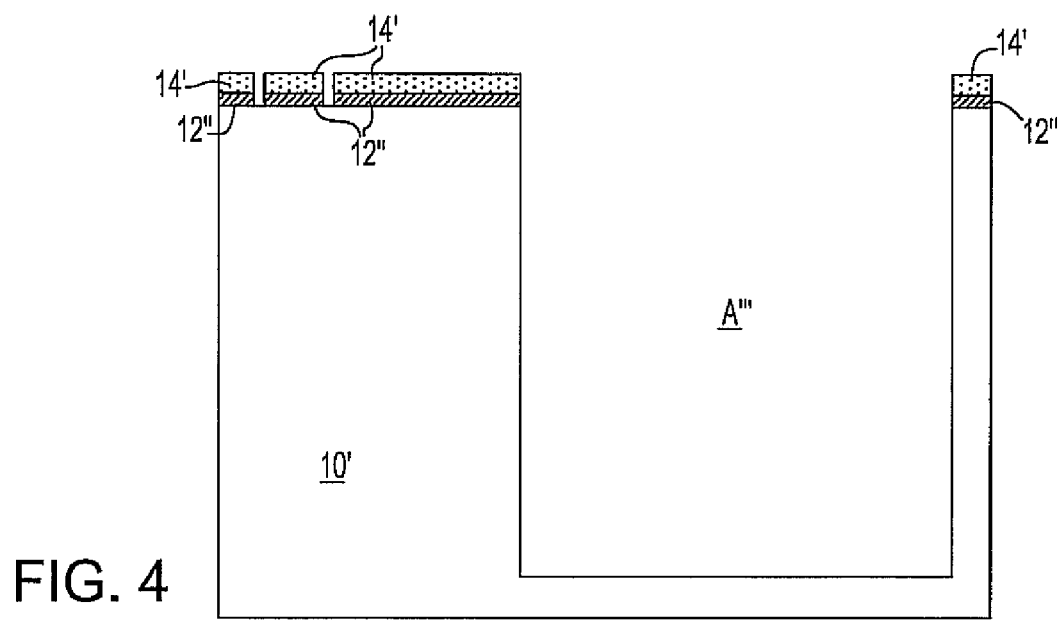

FIG. 4 first shows the results of stripping the resist layer 16 from the semiconductor structure of FIG. 3. Such a stripping of the resist layer 16 provides an aperture A''' from the aperture A". The resist layer 16 may be stripped using methods and materials that are otherwise generally conventional in the semiconductor fabrication art. Included in particular are wet chemical stripping methods, dry plasma stripping methods and combinations of wet chemical stripping methods and dry plasma stripping methods.

FIG. 4 also shows the results of etching the pad dielectric 12' while using the hard mask 14' as a mask to form a pad dielectric 12". The foregoing etching of the pad dielectric 12' to form the pad dielectric 12" may also be effected using a plasma etch method that preferably also provides a perpendicular sidewall to the pad dielectric 12". In contrast to the plasma etch method that is used for forming the hard mask 14' and the pad dielectric 12' that are illustrated in FIG. 2 from the corresponding hard mask layer 14 and pad dielectric layer 12 that are illustrated in FIG. 1, such a plasma etch method will typically and preferably use a fluorine containing etchant gas composition that provides a specificity for the dielectric material from which is comprised the pad dielectric 12" in comparison with the hard mask material from which is comprised the hard mask 14'. As an alternative to a plasma etch method, for example, under circumstances where the pad dielectric 12" comprises a silicon nitride material and the hard mask 14' comprises a silicon oxide material, an aqueous phosphoric acid solution may be used for etching the pad dielectric 12' to form the pad dielectric 12" with an etch specificity with respect to the hard mask 14'.

Figure 5:
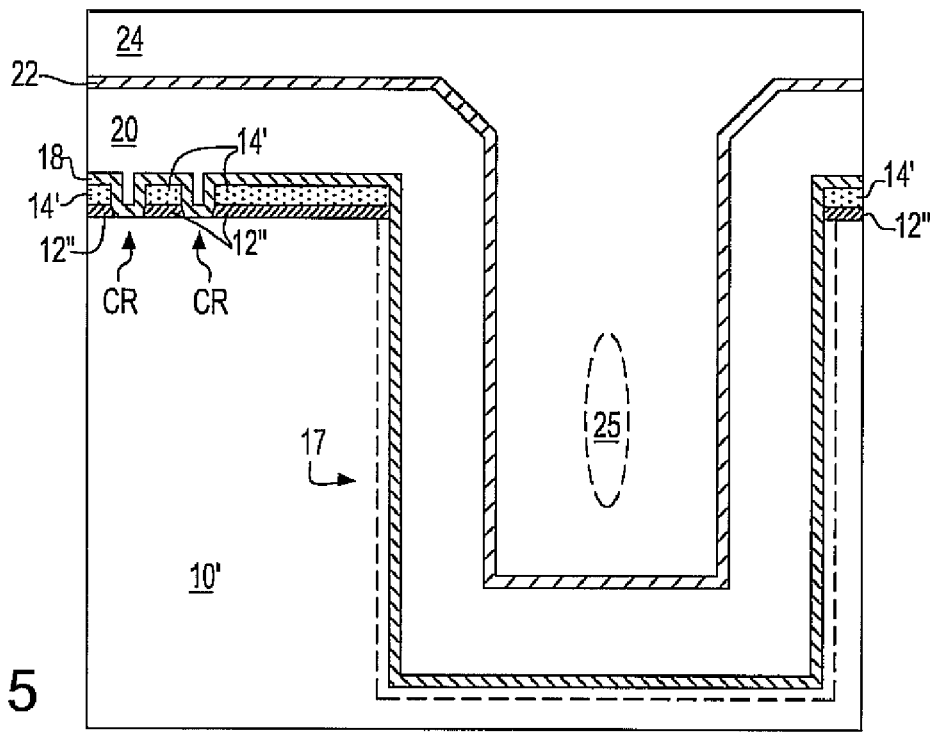

FIG. 5 first shows in phantom an optional conformal dielectric liner layer 17 located and formed lining the aperture A''' that is illustrated in FIG. 4. The optional conformal dielectric liner layer 17 may be either thermally grown, or alternatively deposited, using as non-limiting examples, chemical vapor deposition methods or a physical vapor deposition methods. When thermally grown, the optional conformal dielectric liner layer may comprise an appropriate oxide, nitride or oxynitride of a material (i.e., generally a semiconductor material) from which is comprised the substrate 10'. Deposited dielectric materials may also include oxides, nitrides and oxynitrides of a material from which is comprised the substrate 10'. Deposited dielectric materials may also include generally higher dielectric constant dielectric materials, such as but not limited to barium-strontium-titanates (BSTs) and lead-zirconate-titanates (PZTs). Typically, the optional conformal dielectric liner layer 17 has a generally conventional thickness appropriate for adequate dielectric isolation.

As is understood by a person skilled in the art, the optional conformal dielectric liner layer 17, whether thermally grown or deposited, is removed, if it is formed at all, in what might be intended to be contact region CR areas at the upper left hand portion of the substrate 10', to ensure proper electrical contact of subsequently formed conductor layers in that those areas.

FIG. 5 next shows the results of successively locating and forming upon the microelectronic structure after having formed the optional dielectric liner layer 17: (1) a conformal conductor liner layer 18 located and formed upon the microelectronic structure whose schematic cross-sectional diagram is illustrated in FIG. 4 and incompletely filling the aperture A'''; (2) a conformal conductor layer 20 located and formed upon the conformal conductor liner layer 18 and also incompletely filling the aperture A'''; (3) a conformal stop layer 22 located and formed upon the conformal conductor layer 20 and also incompletely filling the aperture A'''; and finally (4) a plug layer 24 located and formed upon the conformal stop layer 22 and completely filling the aperture A'''.

The conformal conductor liner layer 18 may under certain circumstances also be optional within the instant embodiment. However, when present, the conformal conductor liner layer 18 may comprise the same conductor materials or related conductor materials as the conformal conductor layer 20. The conformal conductor liner layer 18 may thus serve as a seed layer. The conformal conductor layer 18 may alternatively comprise an appropriate conductor barrier material and thus serve as a barrier layer. Typically, the conformal conductor liner layer 18 has a generally conventional thickness appropriate to either of the foregoing functions, or any other functions, that the conformal conductor liner layer may serve.

The conformal conductor layer 20 comprises a conductor material. Typical conductor materials may be selected from the group including but not limited to aluminum, copper, titanium, tantalum and tungsten conductor materials. Also included are alloys of the foregoing conductor materials, as well as nitrides of the foregoing conductor materials and silicides of the foregoing conductor materials. The conformal conductor layer 20 may also be formed using methods that are generally conventional in the microelectronic fabrication art. Included in particular, but not necessarily limiting, are chemical vapor deposition methods and physical vapor deposition methods. Also included are thermal and plasma nitridation methods. Typically, the conformal conductor layer 20 comprises a tungsten conductor material that has a conformal thickness from about 10,000 to about 25,000 angstroms.

The conformal stop layer 22 comprises a stop material. Suitable stop materials include dielectric stop materials and conductor stop materials. More particularly common are dielectric stop materials. The dielectric stop materials from which may be comprised the conformal stop layer 22 may be selected from the same group of dielectric materials from which may be comprised: (1) the optional conformal dielectric liner layer 17; or alternatively (2) the pad dielectric 12" or the hard mask 14'. Typically, the conformal stop layer 22 comprises a dielectric stop material, and more particularly a silicon nitride dielectric stop material, that has a thickness from about 1200 to about 3000 angstroms.

The plug layer 24 comprises a plug material selected for enhanced conformality and ease of final fill of the aperture A'''. Commonly, and for practical purposes, the plug layer 24 typically comprises a dielectric material, although certain conductor materials are not excluded for the plug layer 24. Such a dielectric material from which may be comprised the plug layer 24 may also be selected from the same group of dielectric materials from which may be comprised: (1) the conformal stop layer 22; (2) the conformal dielectric liner layer 17; (3) the hard mask 14'; and (4) the pad dielectric 12", but with the proviso that such a dielectric plug layer 24 and the conformal stop layer 22 comprise dielectric materials having mutually exclusive etch selectivity properties. Within the context of the instant embodiment, such a dielectric plug layer 24 and the hard mask 14' typically comprise a silicon oxide dielectric material, while the conformal stop layer 22 and pad dielectric 12" typically comprise a silicon nitride material. Finally, as is illustrated in phantom within the schematic cross-sectional diagram of FIG. 5, but excluded for clarity within subsequent drawing figures, the dielectric plug layer 24 may include a void 25.

Figure 6:
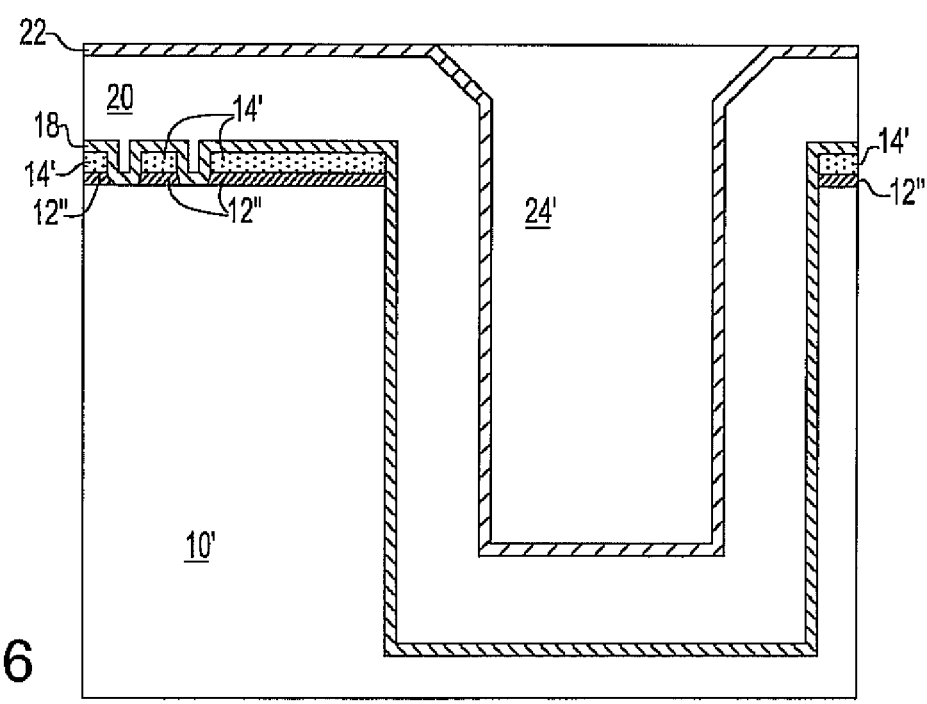

FIG. 6 shows the results of nominally planarizing the plug layer 24 to form a plug layer 24'. The foregoing nominal planarization of the plug layer 24 to form the plug layer 24' may be effected using methods and materials that are otherwise generally conventional in the microelectronic fabrication art. Included in particular are etchback planarization methods that may include reactive ion etch methods and wet chemical etch methods, as well as alternative mechanical planarization methods such as but not limited to purely mechanical planarizing methods, and chemical mechanical polish planarizing methods. Within the context of an etchback planarization method such as a reactive ion etch method or a wet chemical etch method, the stop layer 22 may function as an end point detection layer. Alternatively, within the context of a planarizing method, such as in particular a chemical mechanical polish planarizing method, the stop layer 22 may function as a planarizing stop layer.

Figure 7:
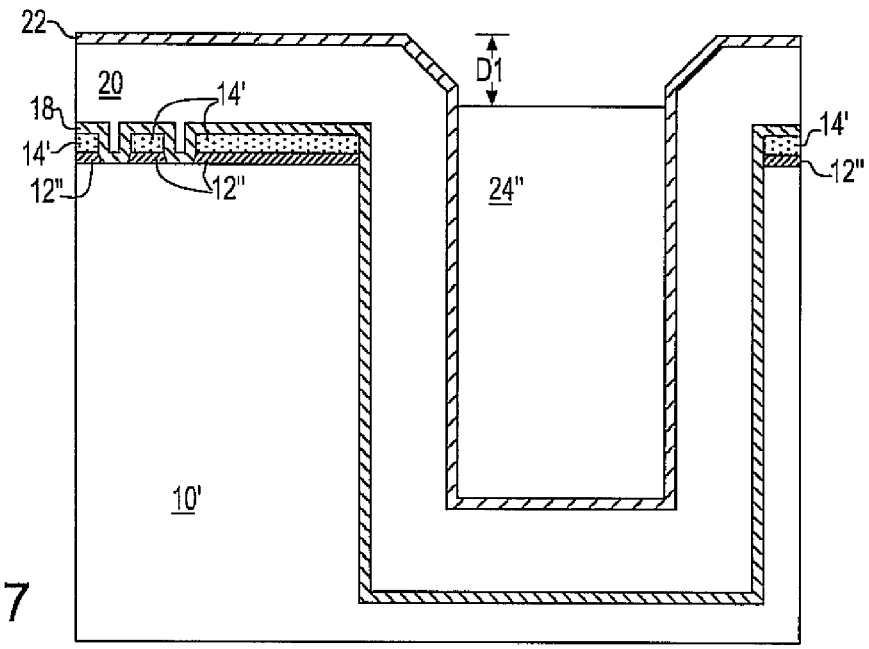

FIG. 7 shows the results of further etching back of the plug layer 24' to form a plug layer 24". The plug layer 24' may be etched back to form the plug layer 24" while using an etch method that is otherwise generally conventional in the semiconductor fabrication art. Such an etch method may include, but is not necessarily limited to, a wet chemical etch method or a dry plasma etch method that may be used for forming the plug layer 24' that is illustrated in FIG. 6 from the plug layer 24 that is illustrated in FIG. 5. Wet chemical etch methods are particularly desirable insofar as wet chemical etch methods may often readily be provided with superior selectivity for a dielectric material from which is comprised the plug layer 24" in comparison with a dielectric material from which is comprised the conformal stop layer 22. When the plug layer 24" comprises a silicon oxide material and the conformal stop layer 22 comprises a silicon nitride material, the plug layer 24" may be etched with specificity with respect to the conformal stop layer 22 while using an aqueous hydrofluoric acid solution. Typically, the plug layer 24" is etched to a distance D1 beneath a surface of the conformal stop layer 22, which is intended as a distance (i.e., depth) equal to the thickness of the conformal conductor layer 20.

Figure 8A:
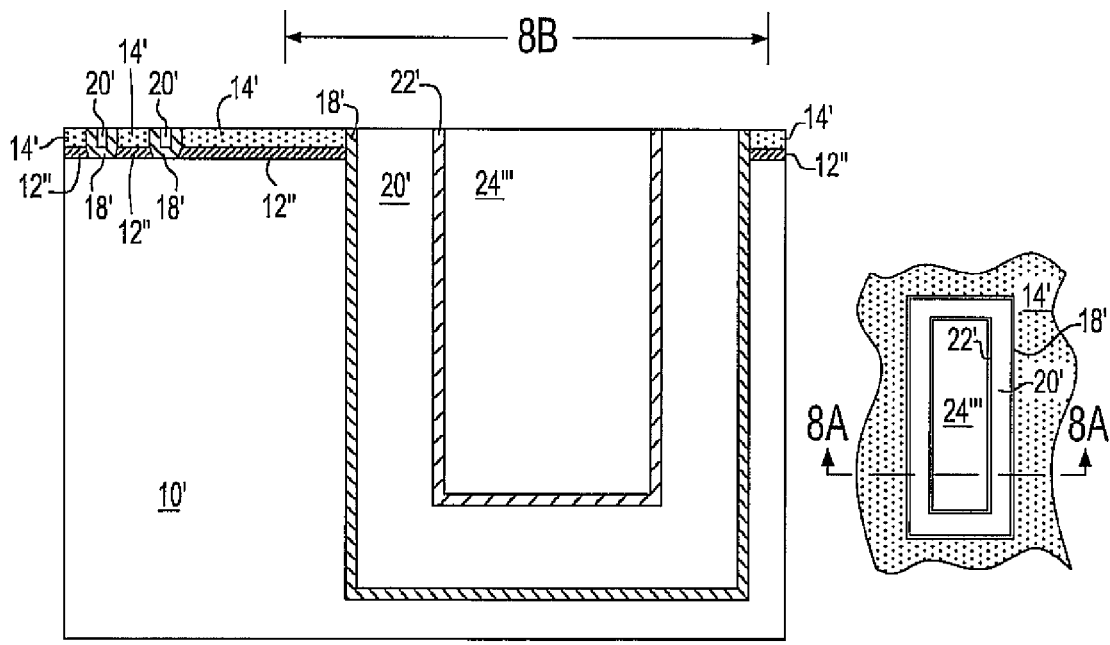

FIG. 8A shows a schematic cross-sectional diagram that illustrates the results of further planarizing of the microelectronic structure of FIG. 7. Resulting from such further planarizing are: (1) a plurality of conformal liner layers 18' that result from planarizing the conformal liner layer 18; (2) a plurality of conformal conductor layers 20' that result from planarizing the conformal conductor layer 20; (3) a conformal stop layer 22' that results from planarizing the conformal stop layer 22; and (4) a plug layer 24''' that results from planarizing of the plug layer 24". This additional planarization that forms the microelectronic structure whose schematic cross-sectional diagram is illustrated in FIG. 8A from the microelectronic structure whose schematic cross-sectional diagram is illustrated in FIG. 7 will generally be effected while using a chemical mechanical polish planarizing method, although the instant embodiment is not necessarily so limited.

Figure 8B:
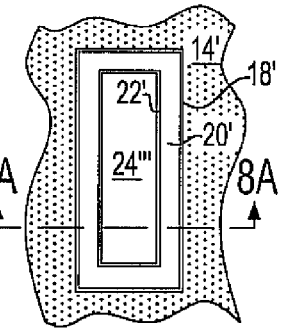

FIG. 8B shows a schematic plan-view diagram of a microelectronic structure that corresponds in part with the microelectronic structure whose schematic cross-sectional diagram is illustrated in FIG. 8A. FIG. 8B shows the hard mask 14', the conformal liner layer 18', the conformal conductor layer 20', the conformal stop layer 22' and the plug layer 24'''. As is illustrated within the schematic cross-sectional diagram of FIGS. 8A and 8B, each of the conformal liner layer 18', the conformal conductor layer 20' and the conformal stop layer 22' is in plan view an annular layer that includes an enclosed bottom. Further, each of the conformal liner layer 18', the conformal conductor layer 20' and the conformal stop layer 22' is successively nested, and each of the conformal liner layer 18', the conformal conductor layer 20' and the conformal stop layer 22' does not fill the aperture A''' that is illustrated in FIG. 4. Beyond the conformal liner layer 18', the conformal conductor layer 20' and the conformal stop layer 22', the plug layer 24''' fills the aperture A''' that is illustrated in FIG. 4.

Figure 9:
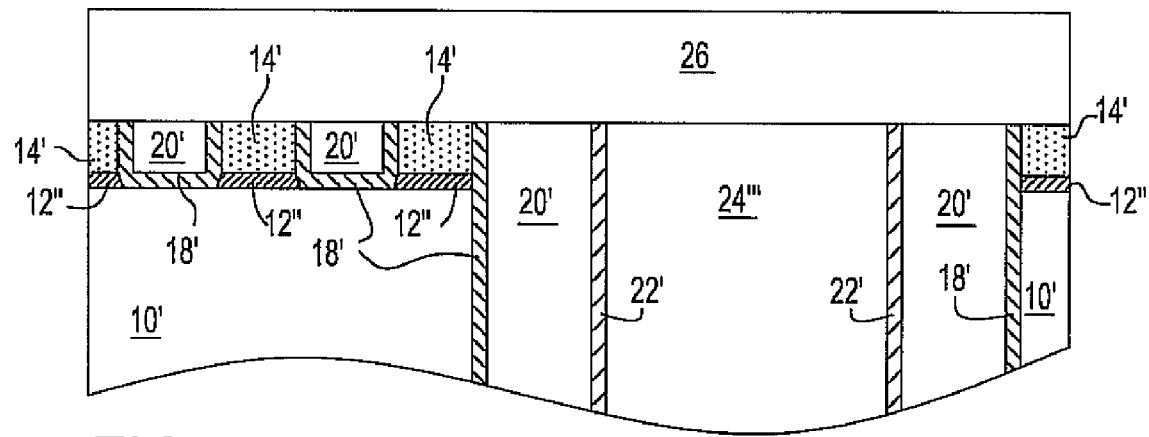

FIG. 9 is in a first instance intended to show a schematic cross-sectional diagram of a bottom truncated microelectronic structure that corresponds with the microelectronic structure whose schematic cross-sectional and plan-view diagrams are illustrated in FIGS. 8A and 8B. FIG. 9 also shows a second conductor layer 26 located and formed upon a top surface of the microelectronic structure whose schematic cross-sectional and plan-view diagrams are illustrated in FIG. 8A and FIG. 8B. The second conductor layer 26 may comprise any of several conductor materials. Non-limiting examples of candidate conductor materials include aluminum, copper, titanium, tantalum and tungsten conductor materials. Also included are alloys of those materials, nitrides of those materials and silicides of those materials. Any of the foregoing conductor materials may be deposited using methods that are otherwise generally conventional in the microelectronic fabrication art. Such methods, and their related materials may be analogous, equivalent or identical to the methods and related materials that may be used for forming the conductor layer 20 that is illustrated in FIG. 5. In this particular embodiment, the second conductor layer 26 comprises an aluminum conductor material. A particular alternative embodiment may include for the second conductor layer 26 a copper conductor material that may be formed using standard semiconductor and microelectronic fabrication processing methodology and apparatus.

Figure 10:
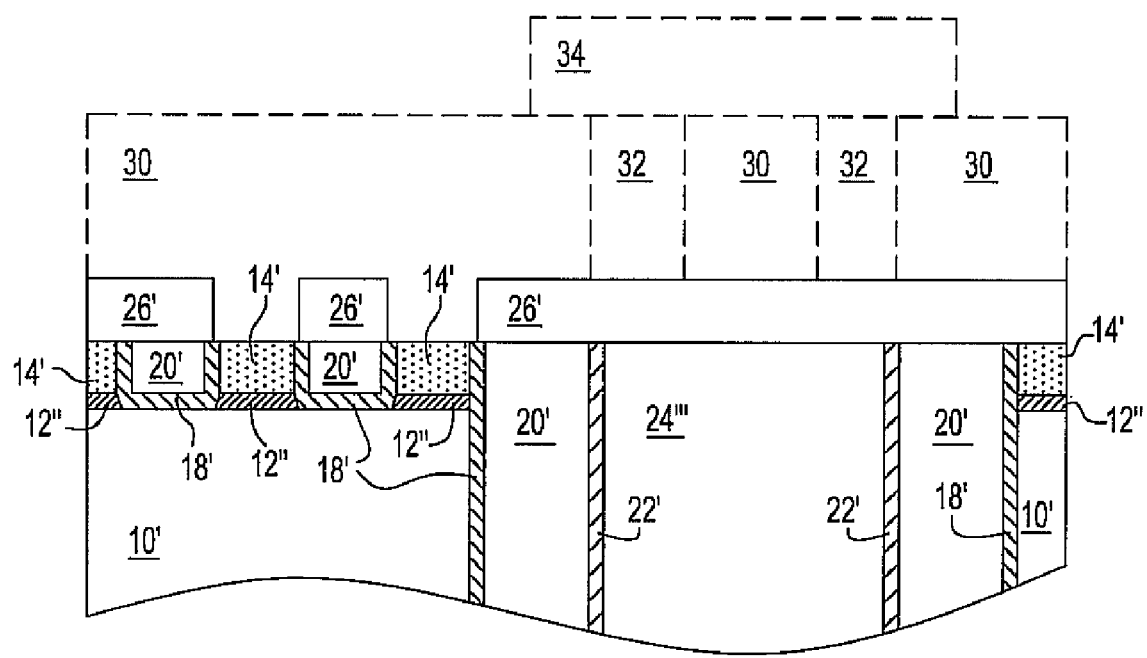

FIG. 10 shows a second conductor layer 26' that results from patterning of the second conductor layer 26 that is illustrated in FIG. 9. The foregoing patterning of the second conductor layer 26 to form the second conductor layer 26' may be effected using photolithographic and etch methods that are otherwise generally conventional in the microelectronic fabrication art. Such photolithographic and etch methods will generally typically include methods that use appropriately dimensioned resist layers, along with plasma etch methods that use appropriate etchant gas compositions.

FIG. 10 also shows, in phantom: (1) a passivating dielectric layer 30 located upon the microelectronic structure of FIG. 9 after having patterned the second conductor layer 26 to form the second conductor layer 26', where the passivating dielectric layer has formed therein a plurality of apertures that expose the second conductor layer 26' that contacts the plug layer 24'''; (2) a plurality of contact vias 32 that fill the plurality of apertures and contact the above designated second conductor layer 26'; and (3) a conductor interconnect layer 34 located and formed upon the passivating dielectric layer 30 and contacting the plurality of contact vias 32.

Each of the foregoing structures that are illustrated in phantom, and not otherwise illustrated in subsequent drawing figures, may comprise materials, have dimensions and be formed using methods that are otherwise generally conventional in the microelectronic fabrication art. Typically, the passivating dielectric layer 30 comprises an oxide, nitride or oxynitride of silicon, although this particular embodiment is not necessarily so limited. The contact vias 32 may comprise, but are not necessarily limited to any of several metals, metal alloys, metal silicides and metal nitrides. The interconnect layer 34 may comprise a similar conductor material, but not necessarily the same conductor material as the contact vias.

Figure 11:
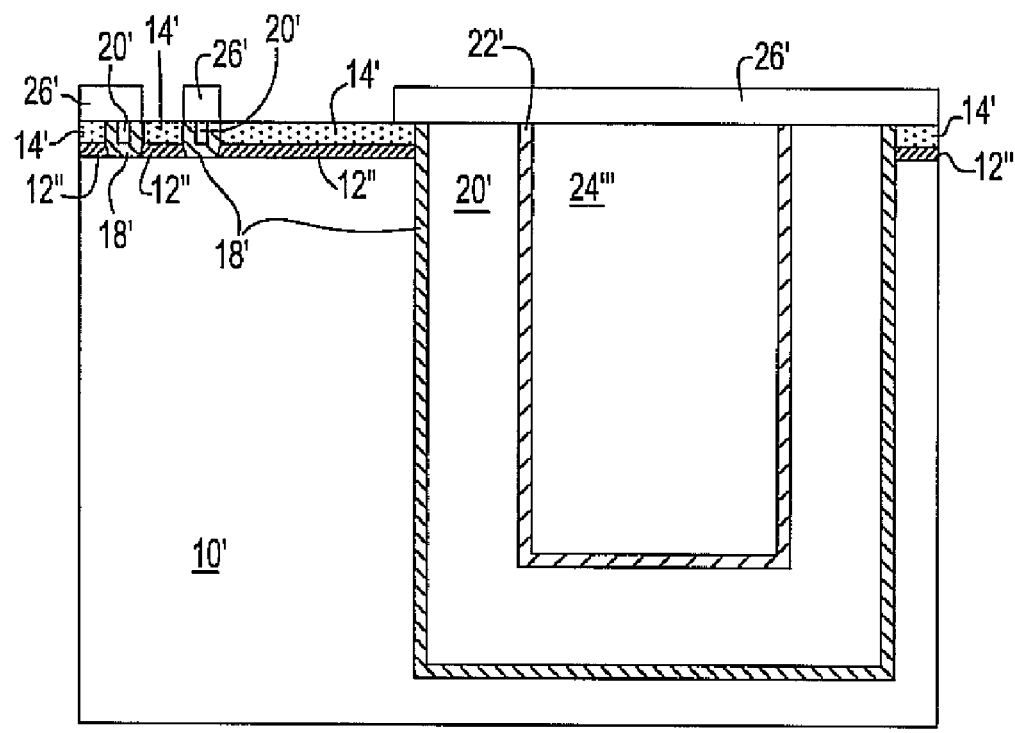

FIG. 11 shows a re-elongated schematic cross-sectional diagram that corresponds with the microelectronic structure whose schematic cross-sectional diagram is illustrated in FIG. 10. Like or identical structures within the microelectronic structures whose schematic cross-sectional diagrams are illustrated in FIG. 10 and FIG. 11 are designated identically.

Figure 12:
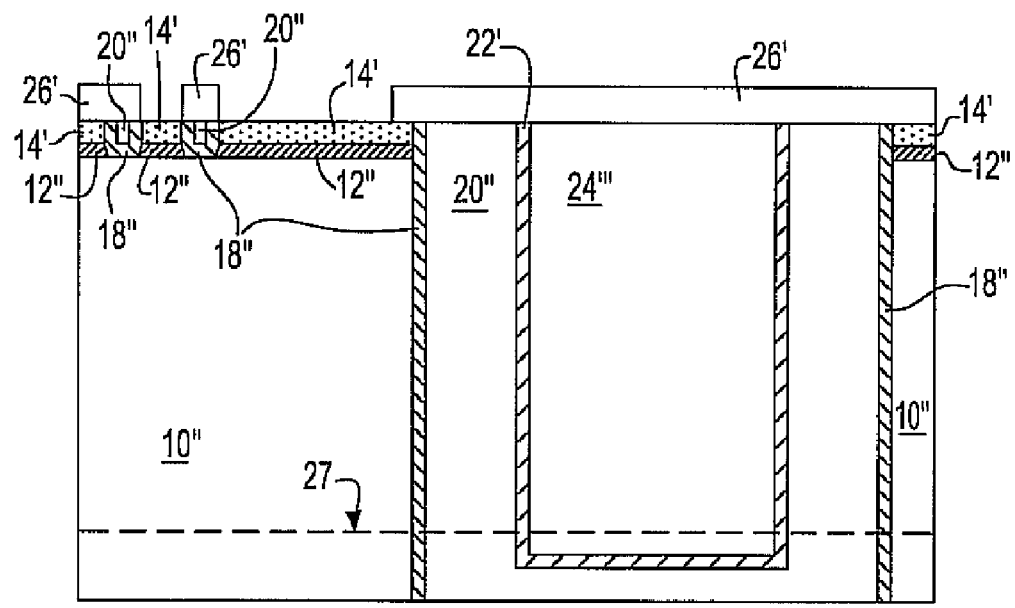

FIG. 12 shows the results of planarizing a bottom surface of the microelectronic structure whose schematic cross-sectional diagram is illustrated in FIG. 11 to provide: (1) a substrate 10'' from the substrate 10'; (2) a conductor liner layer 18'' from the conformal conductor liner layer 18'; and (3) a conductor layer 20'' from the conformal conductor layer 20'. The foregoing planarization of the bottom surface of the microelectronic structure of FIG. 11 to provide the microelectronic structure of FIG. 12 may be effected using methods including but not limited to purely mechanical planarizing methods and chemical mechanical polish planarizing methods. As is illustrated within the schematic cross-sectional diagram of FIG. 12, the microelectronic structure is planarized to provide that the conductor layer 20'' still has an enclosed bottom, although such a feature of the microelectronic structure whose schematic cross-sectional diagram is illustrated in FIG. 12 is not a limitation of the embodiment or of the invention. Rather, within the context of the embodiment, each of the conformal conductor liner layer 18', the conductor layer 20' and the etch stop layer 22' that are illustrated in FIG. 11 may be planarized to leave exposed portions of a resulting conductor liner layer, a resulting conductor layer, a resulting stop layer and a resulting plug layer, in accordance with the phantom line that corresponds with reference numeral 27.

Figure 13:
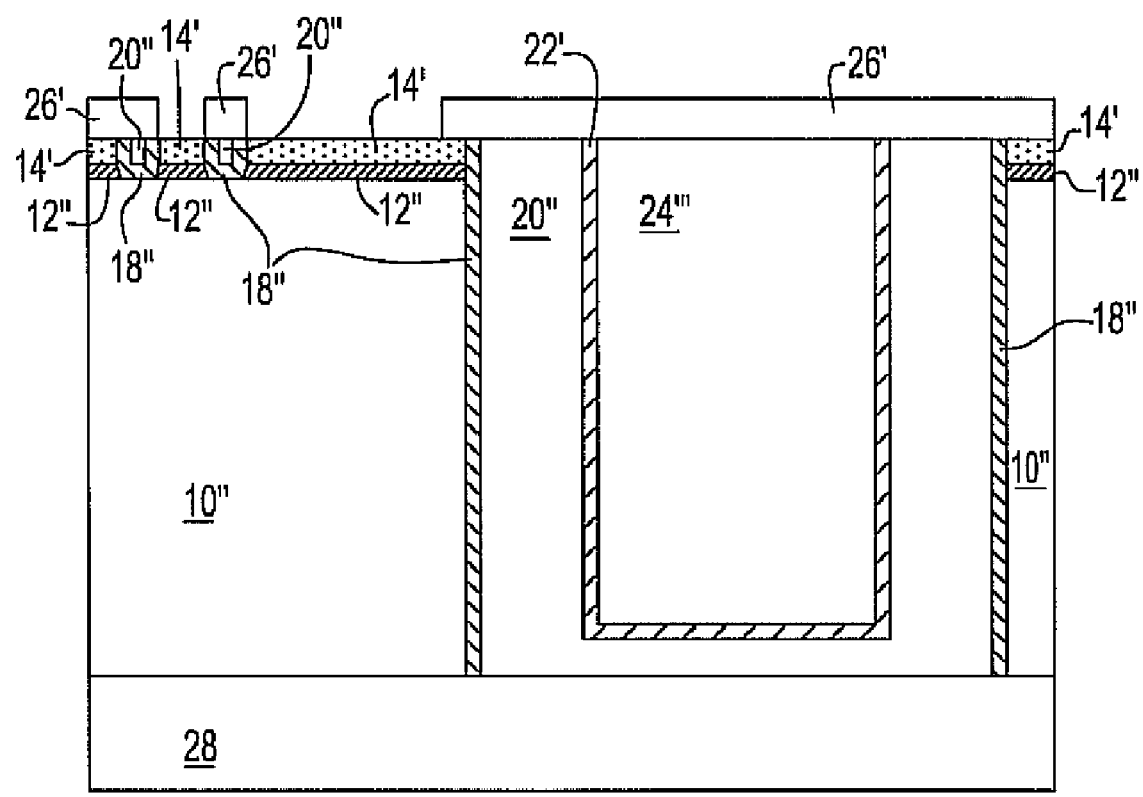

FIG. 13 shows a third conductor layer 28 located and formed upon a bottom surface of the microelectronic structure whose schematic cross-sectional diagram is illustrated in FIG. 12. The third conductor layer 28 is otherwise generally analogous or equivalent with the second conductor layer 26 that is illustrated in FIG. 9 within the context of conductor materials and methods of fabrication, but rather located and formed upon a bottom surface of the of the microelectronic structure that is illustrated in FIG. 12 rather than the top surface of the microelectronic structure that is illustrated in FIG. 12. Typically, the third conductor layer 28 comprises a conductor material of a thickness that meets the prescribed and required performance metrics for resistance within the microelectronic structure whose schematic cross-sectional diagram is illustrated in FIG. 13.

FIG. 13 shows a schematic cross-sectional diagram of a microelectronic structure in accordance with a particular embodiment of the invention. The microelectronic structure includes a substrate 10'' that includes an aperture that is formed completely through the substrate 10''. Successively nested within the aperture is: (1) a conductor liner layer 18'' at a periphery of the aperture and not filling the aperture; (2) a conductor layer 20'' located upon the conductor liner layer 18'' and also not filling the aperture; (3) a stop layer 22' located upon the conductor layer 20'' and also not filling the aperture; and (4) a plug layer 24''' located upon the etch stop layer 22' and filling the aperture.

Within the instant embodiment, the conductor layer 20'' comprises in part an annular via through the substrate 10''. The annular via is more readily fabricated through the substrate 10'' than a non-annular via since the annular via is formed into a generally wider initially blind aperture. Similarly, the plug layer 24''' that completely fills the aperture is formed of a material generally selected to fill conformally the aperture when providing the annular via.

The preferred embodiment is illustrative of the invention rather than limiting of the invention. Revisions and modifications may be made to methods, materials, structures and dimensions of a microelectronic structure in accordance with the preferred embodiment of the invention, while still providing a microelectronic structure and a method for fabrication thereof in accordance with the invention, further in accordance with the accompanying claims.

What is claimed is:

1. A microelectronic structure comprising:
   a substrate including an aperture that penetrates through the substrate;
   a barrier layer on sidewalls of the aperture;
   an annular conductor layer directly on the barrier layer and located at a periphery of the aperture and not filling the aperture, wherein the annular conductor layer includes a base portion that extends across a width of the aperture to provide an enclosed bottom, wherein the base portion of the annular conductor layer is in contact with the barrier layer on each of the sidewalls of the aperture;
   a plug layer located surrounded by the annular conductor layer and filling the aperture, wherein the plug layer is comprised of a dielectric material having a void present therein; and
   a base conductor layer in direct contact with the base portion of the annular conductor layer.

2. The microelectronic structure of claim 1 wherein the substrate comprises a ceramic substrate.

3. The microelectronic structure of claim 1 wherein the substrate comprises a semiconductor substrate.

4. The microelectronic structure of claim 1 wherein the annular conductor layer comprises a material selected from the group consisting of aluminum, copper, titanium, tantalum and tungsten.

5. The microelectronic structure of claim 1 further comprising an annular stop layer separating the plug layer from the annular conductor layer.

6. The microelectronic structure of claim 1 further comprising a conductor layer located above the substrate and contacting the annular conductor layer.

7. A semiconductor structure comprising:
   a semiconductor substrate including an aperture that penetrates through the semiconductor substrate;
   an annular barrier layer on sidewalls of the aperture;
   an annular conductor layer located upon the annular barrier layer and not filling the aperture;
   a planarization stop layer located on sidewalls of the annular conductor layer and not filling the aperture, wherein the planarization stop layer comprises a base portion extending across a width of the aperture;
   a plug layer located upon the planarization stop layer and filling the aperture; and
   a base conductor layer in direct contact with the annular conductor layer and the base portion of the planarization stop layer.

8. The microelectronic structure of claim 7, wherein the plug layer is a dielectric having a void present therein.

* * * * *